(12) United States Patent
Kim et al.

(10) Patent No.: US 11,037,497 B2
(45) Date of Patent: Jun. 15, 2021

(54) DISPLAY DEVICE INCLUDING SHIELDING LAYERS

(71) Applicant: Samsung Display Co., Ltd., Yongin-si (KR)

(72) Inventors: Minki Kim, Hwaseong-si (KR); Hyungwoo Kwon, Seongnam-si (KR); Gyunsoo Kim, Daejeon (KR); Kijong Kim, Chungcheongbuk-do (KR); Seunghwan Baek, Seoul (KR); Insu Baek, Seoul (KR); Kwangwook Choi, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/693,040

(22) Filed: Nov. 22, 2019

(65) Prior Publication Data
US 2020/0168157 A1 May 28, 2020

(30) Foreign Application Priority Data
Nov. 23, 2018 (KR) ........................ 10-2018-0146260

(51) Int. Cl.
G09G 3/3258 (2016.01)
H05K 9/00 (2006.01)
H01L 27/32 (2006.01)

(52) U.S. Cl.
CPC ....... *G09G 3/3258* (2013.01); *H01L 27/3276* (2013.01); *H05K 9/0084* (2013.01); *G09G 2310/0264* (2013.01); *H05K 2201/10128* (2013.01)

(58) Field of Classification Search
None
See application file for complete search history.

(56) References Cited

U.S. PATENT DOCUMENTS

| 7,800,730 B2 | 9/2010 | Kang et al. | |
| 2011/0095770 A1* | 4/2011 | Kurashima | G06F 3/0446 324/679 |
| 2014/0319523 A1* | 10/2014 | Lee | H01L 22/34 257/48 |
| 2016/0157337 A1* | 6/2016 | Go | G09G 3/20 345/212 |

FOREIGN PATENT DOCUMENTS

| KR | 10-1071138 B1 | 10/2011 |
| KR | 1020180046383 A | 5/2018 |

* cited by examiner

*Primary Examiner* — Matthew Yeung
(74) *Attorney, Agent, or Firm* — Cantor Colburn LLP

(57) ABSTRACT

The display device includes a display panel, a connecting circuit board physically connected to the display panel; a driving circuit board physically connected to the connecting circuit board; a driving element disposed on the connecting circuit board and comprising a first surface, and a second surface facing the connecting circuit board and which is opposite to the first surface; a first shielding layer disposed on a first surface of the driving element which is exposed outside the display device; and a second shielding layer overlapping an entirety of the first shielding layer and disposed on the connecting circuit board.

20 Claims, 14 Drawing Sheets

DISPLAY DEVICE INCLUDING SHIELDING LAYERS

This application claims priority to Korean Patent Application No. 10-2018-0146260, filed on Nov. 23, 2018, and all the benefits accruing therefrom under 35 U.S.C. § 119, the entire contents of which are hereby incorporated by reference.

BACKGROUND

(1) Field

The present disclosure herein relates to a display device, and more particularly, to a display device with improved driving reliability.

(2) Description of the Related Art

Various display devices used for multimedia devices such as a television, a mobile phone, a tablet computer, a navigation system, a game machine are being developed. A display device displays an image, and may include a display module for sensing an external input and a circuit board which is electrically connected to the display module. Specifically, the display module may include a display panel for displaying an image and an input sensing unit for sensing an external input.

A circuit board may include a driving element for receiving an external driving signal and transmitting the same to a display module thereon. The driving element may transmit various driving signals required for the operation of a display module, to the display module.

SUMMARY

The present disclosure provides a display device capable of protecting a driving element from static electricity.

An embodiment of the invention provides a display device including a display panel, a connecting circuit board physically connected to the display panel and through which a signal is provided to the display panel, a driving circuit board physically connected to the connecting circuit board, a driving element disposed on the connecting circuit board and comprising a first surface, and a second surface facing the connecting circuit board and which is opposite to the first surface, a first shielding layer disposed on the first surface of the driving element which is exposed outside the display device, a second shielding layer overlapping an entirety of the first shielding layer disposed on the connecting circuit board.

In an embodiment, the first shielding layer may include a first adhesive disposed on the driving element and a first shielding film which is disposed on the first adhesive, and the second shielding layer may include a second adhesive disposed on the first shielding film and a second shielding film which is disposed on the second adhesive.

In an embodiment, in a thickness direction of the connecting circuit board, a thickness of the first shielding film may be greater than a thickness of the second shielding film.

In an embodiment, in a thickness direction of the connecting circuit board, a thickness of the first adhesive may be greater than a thickness of the second adhesive.

In an embodiment, a planar area of the first shielding layer may be the same as a planar area of the driving element.

In an embodiment, a planar area of the second shielding layer may be greater than a planar area of the first shielding layer.

In an embodiment, the second shielding layer may include a first portion corresponding to an entirety of a planar area of the driving element, a second portion and a third portion between which is disposed the first portion, and the second portion and the third portion may respectively extend from sides of the first portion which oppose each other along a direction, to both cover side surfaces of the driving element which oppose each other along the direction and to overlap the connecting circuit board.

In an embodiment, a portion of each of the second portion and the third portion may not overlap the driving element and may be spaced apart from the connecting circuit board and the driving element.

In an embodiment, the second shielding layer may include a first portion corresponding to an entirety of a planar area of the driving element, and a second portion which surrounds the first portion in a top plan view, the second portion extending from all sides of the first portion to both cover all side surfaces of the driving element respectively corresponding to the all sides of the first portion and to overlap the connecting circuit board.

In an embodiment, the display panel may include a base substrate including a bending portion, and a first flat portion and a second flat portion which are spaced apart from each other with the bending portion interposed therebetween and facing each other, and a display element layer disposed on the first flat portion. The connecting circuit board may be disposed on the second flat portion.

In an embodiment, the connecting circuit board may include an upper surface facing the driving element and a lower surface which is opposite to the upper surface, the driving circuit board may be connected to the connecting circuit board at the upper surface of the connecting circuit board, and the base substrate of the display panel may be connected to the connecting circuit board at the lower surface of the connecting circuit board.

In an embodiment, the display panel may include a pad disposed on the second flat portion and through which the signal is received from the connecting circuit board; the driving circuit board may include a driving pad through which the signal is transmitted to the connecting circuit board; and the connecting circuit board may include: a first connecting pad disposed facing the lower surface and electrically connected to the pad of the display panel, and a second connecting pad disposed facing the upper surface and electrically connected to the driving pad of the driving circuit board.

In an embodiment, the display device may further include an input sensing unit which is disposed on the display panel and with which an external input is sensed; a first circuit board physically connected to the input sensing unit; a second circuit board physically connected to the first circuit board; a sensing driving element disposed on the first circuit board; a third shielding layer disposed on the sensing driving element which is exposed outside the display device; and a fourth shielding layer overlapping an entirety of the third shielding layer disposed on the first circuit board.

In an embodiment, the connecting circuit board and the first circuit board may each be a flexible circuit board.

In an embodiment, a planar area of the third shielding layer may be the same as a planar area of the sensing driving element.

In an embodiment, the fourth shielding layer may include a first portion corresponding to an entirety of the planar area of the sensing driving element, and a second portion extended from two sides of the first portion to both cover two side surfaces of the sensing driving element which correspond to the two sides of the first portion and to overlap the second circuit board.

In an embodiment of the invention, a display device includes a display panel, an input sensing unit which is disposed on the display panel; a first circuit board physically connected to the input sensing unit and through which a signal is provided to the input sensing unit; a second circuit board physically connected to the first circuit board and from which the signal is provided to the first circuit board; a sensing driving element disposed on the first circuit board and comprising a first surface, and a lower surface facing the connecting circuit board and which is opposite to the first surface; a first shielding layer disposed on the first surface of the sensing driving element; and a second shielding layer overlapping an entirety of the first shielding layer and disposed on the first circuit board.

In an embodiment, along a thickness direction of the first circuit board, a first thickness of the first shielding layer may be greater than a second thickness of the second shielding layer, and a sum of the first thickness and the second thickness may be about 50 micrometers to about 65 micrometers.

In an embodiment, a planar area of the first shielding layer may be the same as a planar area of the sensing driving element.

In an embodiment, the display device may further include an adhesive layer disposed between the display panel and the input sensing unit.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
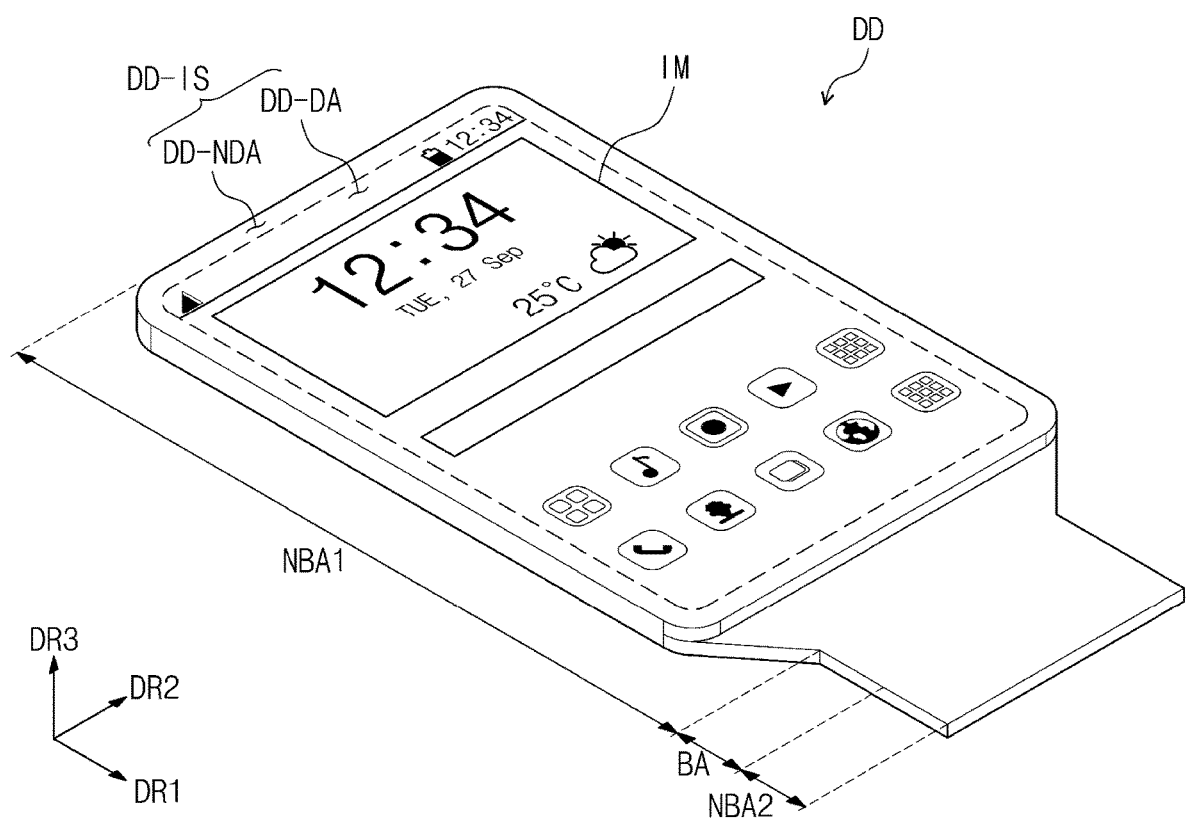
FIG. 1A and FIG. 1B are perspective views of embodiments of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the present disclosure, when an element (or a region, a layer, a portion, etc.) is referred to as being related to another element such as being "on," "connected to," or "coupled to" another element, it means that the element may be directly disposed on/connected to/coupled to the other element, or that a third element may be disposed therebetween. In contrast, when an element (or a region, a layer, a portion, etc.) is referred to as being related to another element such as being "directly on," "directly connected to," or "directly coupled to" another element, it means that no third element is disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the invention.

The terminology used herein is for the purpose of describing particular embodiments only and is not intended to be limiting. The terms of a singular form may include plural forms unless the context clearly indicates otherwise. As used herein, the singular forms "a," "an," and "the" are intended to include the plural forms, including "at least one," unless the content clearly indicates otherwise. "At least one" is not to be construed as limiting "a" or "an." "Or" means "and/or."

In addition, terms such as "below," "lower," "above," "upper," and the like are used to describe the relationship of the configurations shown in the drawings. The terms are used as a relative concept and are described with reference to the direction indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the accompanying drawings.

Figure 1B:
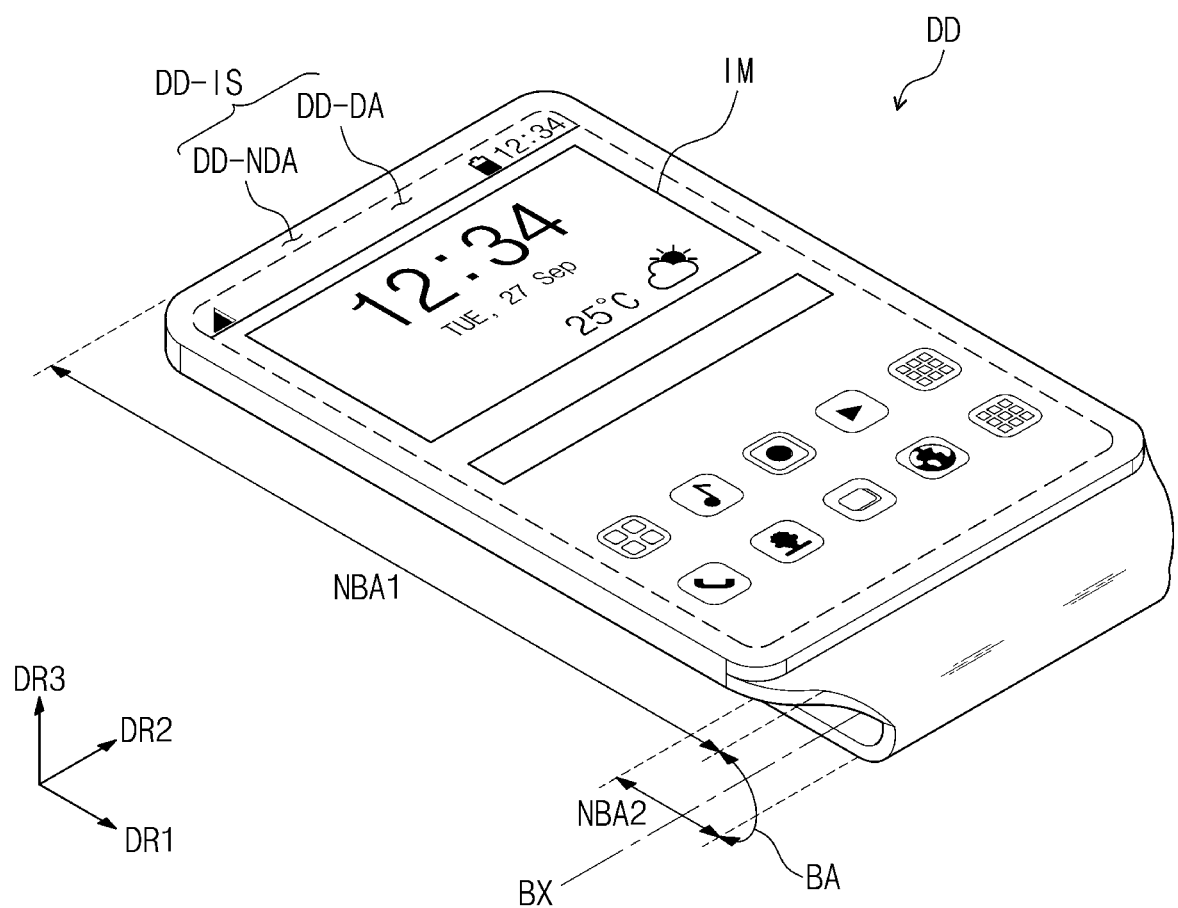
Figure 2A:
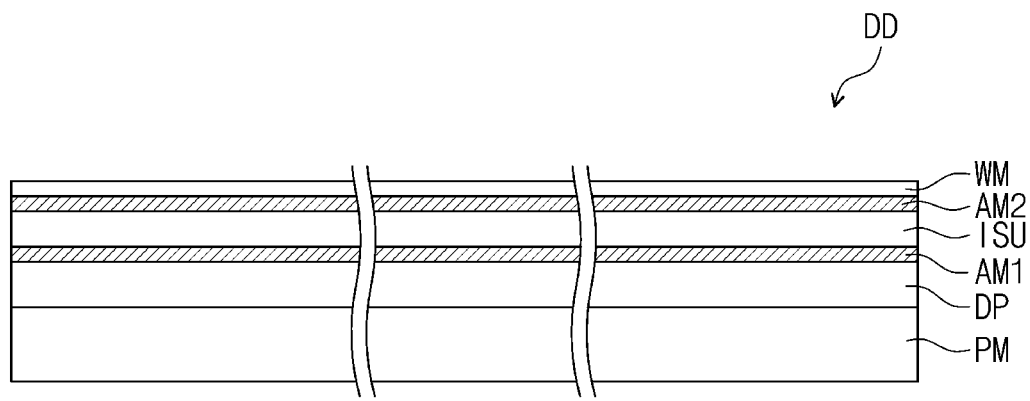
FIG. 2A is a cross-sectional view of an embodiment of a display device.
Figure 2A:
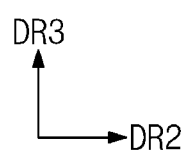
Figure 2B:
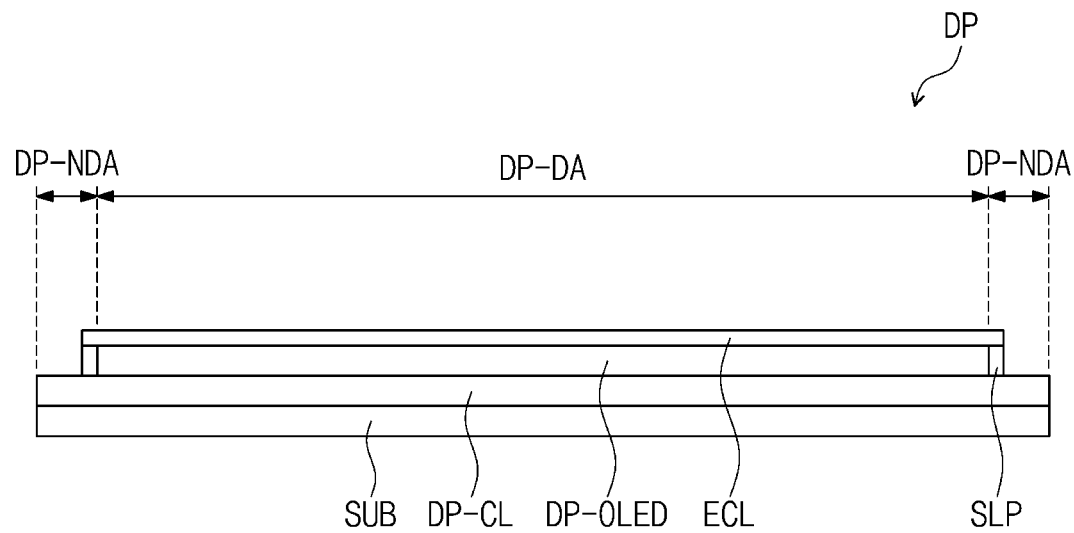
FIG. 2B is a cross-sectional view of another embodiment of a display panel of a display device.
Figure 2B:
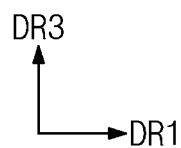

FIG. 1A and FIG. 1B are perspective views of embodiments of a display device. FIG. 2A is a cross-sectional view of an embodiment of a display device. FIG. 2B is a cross-sectional view of an embodiment of a display panel of a display device.

Referring to FIG. 1A and FIG. 1B, a display surface DD-IS may have a shape extended in each of a first direction DR1 and a second direction DR2 which crosses the first direction DR1. The normal direction of the display surface DD-IS, that is, the thickness direction of a display device DD is indicated by a third direction DR3. In the present disclosure, "when viewed in a (top) plan view," "in a (top) plan view," or "planar area" may mean when viewed along the third direction DR3. A front surface (or an upper surface) and a back surface (or a lower surface) of each of layers or units described below are determined along the third direction DR3. However, directions indicated by the first to third directions DR1, DR2, and DR3 are a relative concept, and may be converted to other directions, for example, opposite directions.

The display surface DD-IS is described as a two-dimensional surface, e.g., an entire planar area of the display device DD which is visible in the top plan view. However, the display device DD may include a three-dimensional display surface or a quadrangular display surface. The three-dimensional display surface may include a plurality of display area disposed along different directions, and may include, for example, a polygonal column type display surface.

Also, although not illustrated, electronic modules, a camera module, a power module and the like mounted on a main circuit board may be disposed in a bracket/case and the like, together with the display device DD, to configure an electronic device such as a mobile phone terminal. The display device DD according to the invention may be applied to relatively large electronic devices such as a television and a monitor, and relatively small and medium-sized electronic devices such as a computer tablet, a car navigation system unit, a game machine, and a smart phone.

As shown in FIG. 1A, the display surface DD-IS includes a display area DD-DA at which an image IM is displayed, and a non-display area DD-NDA which is adjacent to the display area DD-DA. The non-display area DD-NDA may be a region on which the image IM is not displayed. In FIG. 1A, as an example of the image IM, a watch window and application icons are collectively illustrated. In another embodiment, the non-display area DD-NDA may be adjacent to only one side of the display area DD-DA, or be omitted.

Particularly, the display device DD according to the invention may include a first non-bending area NBA1, a second non-bending area NBA2, and a bending area BA. The display device DD and/or components thereof are bendable in the bending area BA. The display device DD and/or components thereof may not be bendable, or may be maintained in a non-bent (e.g., flat) shape, in the first non-bending area NBA1 and the second non-bending area NBA2, even when the display device DD is bent. The first non-bending area NBA1, the second non-bending area NBA2, and the bending area BA may be defined on the basis of a display panel DP and components thereof, to be described later with reference to FIG. 3.

In a top plan view, the display device DD may have different widths along the second direction DR2, depending on a region of the display device DD along the first direction DR1. The display device DD in the bending area BA and the second non-bending area NBA2 may have a maximum width along the second direction DR2 which is smaller than a minimum width of the first non-bending area NBA1 along the second direction DR2. Since the display device DD at the bending area BA has a relatively smaller width than at the first non-bending area NBA1, bending of the display device DD and components thereof may be facilitated.

In FIG. 1A, a boundary region in which the width of the display device DD along the second direction DR2 is gradually reduced may be included in the first non-bending area NBA1. However, in another embodiment of the invention, the boundary region in which the width of the display device DD along the second direction DR2 is gradually reduced may be omitted.

As shown in FIG. 1B, the display device DD may be bent at the bending area BA, to be disposed in a bent state. The display device DD is bent at the bending area BA and along a bending axis BX extended along the second direction DR2. The display device DD which is bent disposes the second non-bending area NBA2 facing the first non-bending area NBA1 and spaced apart from the first non-bending area NBA1 along the third direction DR3.

Referring to FIG. 2A, the display device DD includes a protective layer PM, the display panel DP, an input sensing unit ISU, a window WM, and adhesive layers AM1 and AM2.

The window WM may define an outermost surface of the display device DD, such as the display surface DD-IS of the display device DD shown in FIG. 1A. That is, an upper surface of the window WM corresponds to and/or defines the display surface DD-IS. The upper surface of the window WM may include or define the display area DD-DA in which an image is viewable directly from outside the display device DD and the non-display area DD-NDA which is adjacent to the display area DD-DA. As another example, the non-display area DD-NDA may be omitted, such that the display area DD-DA is defined by an entirety of the planar area of the display device DD.

The display area DD-DA defined at the window WM may correspond to a transmissive area in which an image provided from the display panel DP is actually transmitted through the window WM to be visible from outside the display device DD, and the non-display area DD-NDA may correspond to a non-transmissive area in which an image provided from the display panel DP is not transmitted through the window WM. Also, as described above, the non-transmissive area of the window WM may be omitted such that the transmissive area is defined by an entirety of the planar area of the display device DD.

The display panel DP is disposed between the protective layer PM and the input sensing unit ISU. The display panel DP generates an image and the generated image may be viewable to a user disposed external to the display device DD, through the window WM thereof.

According to an embodiment of the invention, the display panel DP may be an organic light emitting display panel, a liquid crystal display panel, or a quantum dot light emitting display panel, but is not particularly limited. An organic light emitting display panel includes organic light emitting elements. A liquid crystal display panel includes liquid crystal molecules. A quantum dot light emitting display panel includes quantum dots, or quantum loads. Hereinafter, the display panel DP according to the invention is described as an organic light emitting display panel.

As shown in FIG. 2B, the display panel DP includes a base substrate SUB, a circuit element layer DP-CL, a display element layer DP-OLED, an encapsulation layer ECL, and a sealant SLP. The display panel DP includes a display area DP-DA and a non-display area DP-NDA. The display area DP-DA and the non-display area DP-NDA of the display panel DP may overlap and respectively correspond to the display area DD-DA and the non-display area DD-NDA of the display device DD described with reference to FIG. 1A. The non-display area DP-NDA may be adjacent to one or more sides of the display area DP-DA, or be omitted.

The base substrate SUB supports overall configurations of various components, elements, layers, etc. of the display panel DP and the input sensing unit ISU, and may include a flexible material. In an embodiment, for example, the base substrate SUB may include a plastic substrate, a glass substrate, or an organic/inorganic composite material substrate. Alternately, the base substrate SUB may have a laminated structure in which a plurality of insulation layers is included. A plastic substrate may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

According to an embodiment of the invention, the bending area BA, the first non-bending area NBA1, and the second non-bending area NBA2 of the display device DD described with reference to FIG. 1B may be defined by a component of the display panel DP, such as the base substrate SUB.

The circuit element layer DP-CL may include a plurality of insulation layers, a plurality of conductive layers, and a semiconductor layer. The plurality of conductive layers of the circuit element layer DP-CL may constitute a control circuit of signal lines and/or of a pixel of the display device DD.

The display element layer DP-OLED overlaps the display area DP-DA and is disposed on the base substrate SUB. The display element layer DP-OLED includes, for example, organic light emitting diodes. However, the embodiment of the invention is not limited thereto. According to the type of the display panel DP, the display element layer DP-OLED may include inorganic light emitting diodes or organic-inorganic hybrid light emitting diodes.

The encapsulation layer ECL encapsulates the display element layer DP-OLED. As an example, the encapsulation layer ECL may overlap the display area DP-DA and the non-display area DP-NDA, respectively, or may not overlap the non-display area DP-NDA and only overlap the display area DP-DA.

According to an embodiment of the invention, the encapsulation layer ECL may be an encapsulation substrate. The encapsulation layer ECL protects the display element layer DP-OLED from foreign materials such as moisture, oxygen, and dust particles. The encapsulation layer ECL may be coupled to the base substrate SUB through the sealant SLP. The sealant SLP may include frit. However, this is only exemplary, and the material constituting the sealant SLP is not limited thereto.

According to another embodiment of the invention, the encapsulation layer ECL may be provided as a thin film encapsulation layer. In this case, the sealant SLP may be omitted, and the thin film encapsulation layer may encapsulate the display element layer DP-OLED.

Referring back to FIG. 2A, a first adhesive layer AM1 is disposed between the display panel DP and then input sensing unit ISU. The display panel DP and the input sensing unit ISU may be fixed to each other by the first adhesive layer AM1.

However, the embodiment of the invention is not limited thereto. The first adhesive layer AM1 may be omitted, and in this case, the input sensing unit ISU may be directly disposed on the display panel DP. As used herein, "Component A is directly disposed on Component B" means that no component is disposed between Component A and Component B. In an embodiment where the input sensing unit ISU is directly disposed on the display panel DP, the input sensing unit ISU may be manufactured by a continuous process with the display panel DP.

The input sensing unit ISU is disposed between the window WM and the display panel DP. The input sensing unit ISU may sense an input applied from outside the display device DD. The input applied from the outside may be provided in various forms. In an embodiment, for example, an external input includes various types of external input tools, such as a part of a user's body, a stylus pen, light, heat, or pressure. Also, an input may not only be in the form of a contact by an input tool, but also includes a spatial touch which is disposed in relatively close proximity, or adjacent (for example, hovering) relative to the display device DD.

A second adhesive layer AM2 is disposed between the window WM and the input sensing unit ISU. The input sensing unit ISU and the window WM may be fixed to each other by the second adhesive layer AM2. According to the invention, the first adhesive layer AM1 and the second adhesive layer AM2 may be an optically clear adhesive film, an optically clear resin, or a pressure sensitive adhesive film.

The protective layer PM may support an overall structure of the display panel DP. The protective layer PM reduces or effectively prevents external moisture from penetrating into the display panel DP and absorbs external impact. The protective layer PM may be provided as plastic resins. However, the material constituting the protective layer PM is not limited to plastic resins, and may include an organic/inorganic composite material. The protective layer PM may include a porous organic layer and an inorganic material which is filled in pores of the organic layer. The protective layer PM may further include a functional layer provided or formed on a plastic film. The functional layer includes, but is not limited to a resin layer, and may be formed by coating.

Although not illustrated, the display device DD may further include a polarizing layer disposed on the display panel DP. The polarizing layer may control the polarization of external light which is incident to the display device DD through the window WM.

Figure 3:
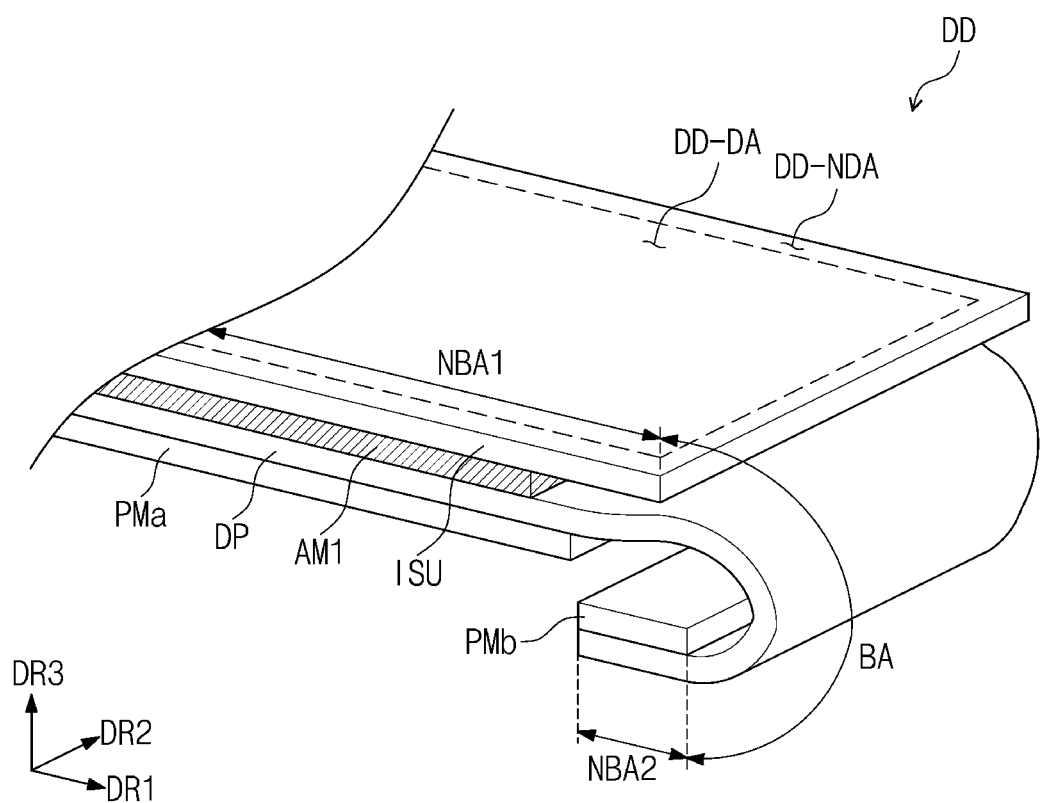
FIG. 3 is a perspective view of an embodiment of an end portion of a display device.

FIG. 3 is a perspective view of an embodiment of an end portion of a display device which is bent.

Referring to FIG. 3, for convenience of description, among the components of the display device DD shown in FIG. 2A, the protective layer PM, the display panel DP, the first adhesive layer AM1, and the input sensing unit ISU are shown and the window WM and the second adhesive layer AM2 are omitted.

The display device DD which is bent disposes the display area DD-DA thereof overlapping the first non-bending area NBA1, entirely, and overlapping the second non-bending area NBA2, partially.

Also, an entirety of the base substrate SUB included in the display panel DP may be provided as or defined by a first flat portion SUB-S1 corresponding to the first non-bending area NBA1, a second flat portion SUB-S2 corresponding to the second non-bending area NBA2, and a bending portion SUB-SB corresponding to the bending area BA. In a top plan view, the first flat portion SUB-S1 may have a greater area than the second flat portion SUB-S2. The display panel DP and/or components thereof are bendable in the bending portion SUB-SB. The display panel DP and/or components thereof may not be bendable, or may be maintained in a non-bent (e.g., flat) shape, in the first flat portion SUB-S1 and the second flat portion SUB-S2, even when the display panel DP is bent.

The first flat portion SUB-S1, the second flat portion SUB-S2, and the bending portion SUB-SB will be described in detail with reference to FIG. 4. The circuit element layer DP-CL, the display element layer DP-OLED, and the encapsulation layer ECL all described with reference to FIG. 2B may be disposed on the first flat portion SUB-S1.

Referring to FIG. 3, the protective layer PM includes a first sub-protective layer PMa and a second sub-protective layer PMb spaced apart from each other along the first direction DR1. The first sub-protective layer PMa may be disposed on the first flat portion SUB-S1, and the second sub-protective layer PMb may be disposed on the second flat portion SUB-S2. In a top plan view, a planar area of the first sub-protective layer PMa may be greater than a planar area of the second sub-protective layer PMb.

Figure 4:
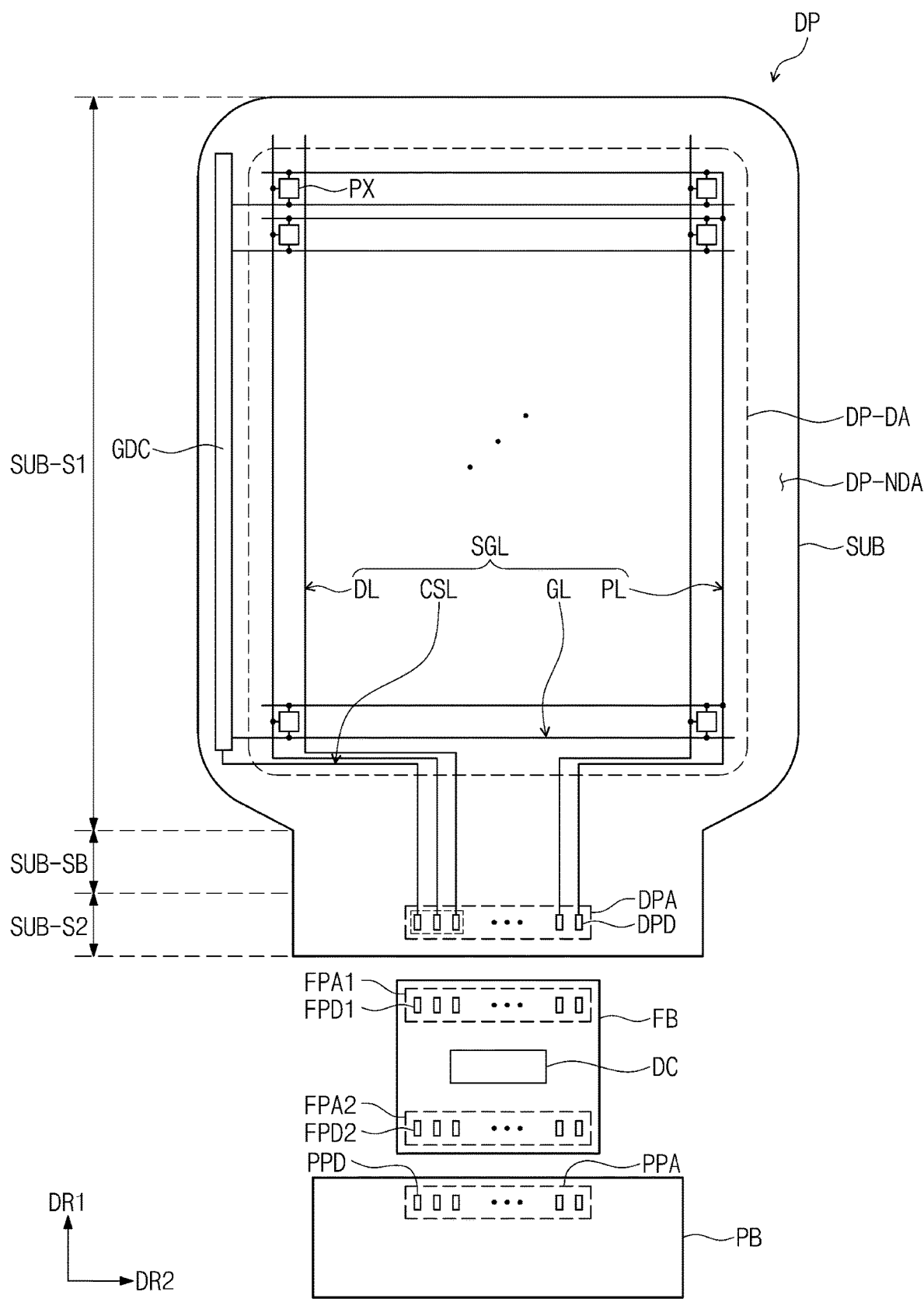
FIG. 4 is a top plan view of an embodiment of a display panel.
Figure 5:
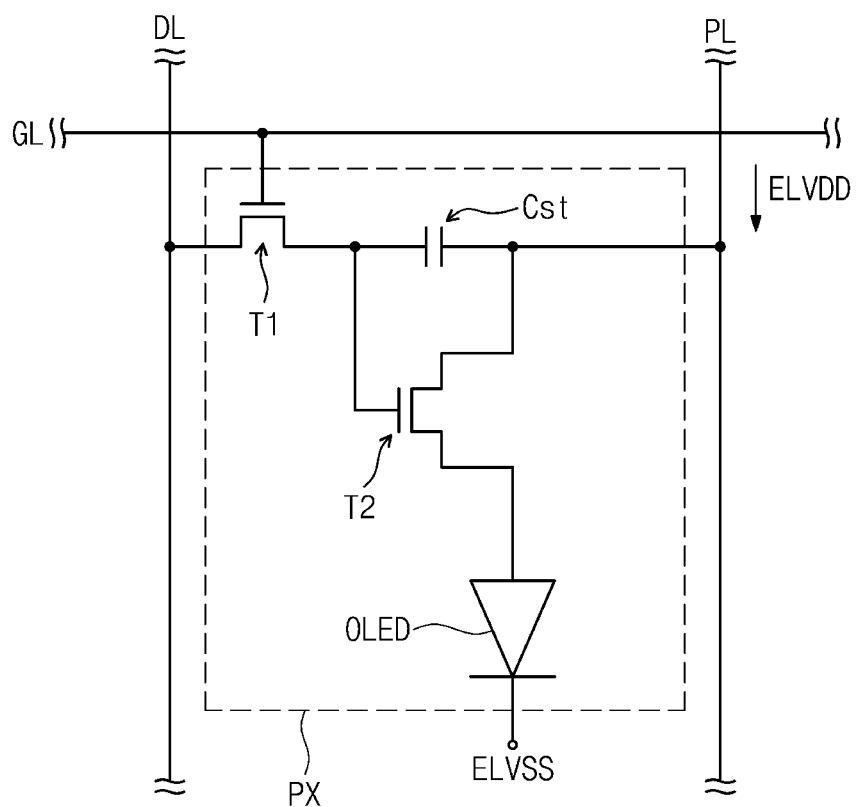
FIG. 5 is an equivalent circuit diagram of an embodiment of a pixel of a display panel of a display device.

FIG. 4 is a top plan view of an embodiment of a display panel. FIG. 5 is an equivalent circuit diagram of an embodiment of a pixel included in a display panel of a display device.

Referring to FIG. 4, the display panel DP may include a driving circuit GDC, a plurality of signal lines SGL, a pad DPD provided in plurality (hereinafter, referred to as pads DPD) collectively disposed in a pad area DPA, and a pixel PX provided in plurality (hereinafter, referred to as pixels PX). The pixels PX are disposed in the display area DP-DA. The pixels PX each include an organic light emitting diode and a pixel driving circuit which is connected to the organic light emitting diode. The driving circuit GDC, the signal lines SGL, the pad DPD provided in plurality in the pad area DPA, and the pixel driving circuit may be included in the circuit element layer DP-CL.

According to an embodiment of the invention, the pixels PX of the display panel DP and the driving circuit GDC of the circuit element layer DP-CL may be disposed on the first flat portion SUB-S1 of the base substrate SUB. The signal lines SGL may be disposed in each of the first flat portion SUB-S1, the second flat portion SUB-S2, and the bending portion SUB-SB, respectively. In an embodiment, a same one signal line among the signal lines SGL may extend to be disposed in each of the first flat portion SUB-S1, the second flat portion SUB-S2, and the bending portion SUB-SB.

The driving circuit GDC generates a plurality of scan signals (hereinafter, scan signals), and sequentially outputs the scan signals to a scan line GL provided in plurality (hereinafter, referred to as scan lines GL) to be described later. The driving circuit GDC may further output another control signal to a driving circuit of the pixels PX.

The driving circuit GDC may include a plurality of thin film transistors provided or formed through the same process of the driving circuit of the pixels PX, for example, a low temperature polycrystalline silicon ("LTPS") process or a low temperature polycrystalline oxide ("LTPO") process.

The signal lines SGL overlap the display area DP-DA and the non-display area DP-NDA, and are connected to the pads DPD. The signal lines SGL include the scan lines GL, a data line DL provided in plurality (hereinafter, referred to as data lines DL), a power line PL, and a control signal line CSL. The scan lines GL are connected to corresponding pixels among the pixels PX, and the data lines DL are each connected to corresponding pixels among the pixels PX. The power line PL is also connected to the pixels PX. The control signal line CSL may provide control signals to a scan driving circuit.

Also, the display device DD includes a connecting circuit board FB connected to an end of the display panel DP and a driving circuit board PB which is connected to an end of the connecting circuit board FB.

The connecting circuit board FB may be provided as a flexible printed circuit board, and includes a first pad area FPA1 in which a first connecting pad FPD1 is provided in plurality (hereinafter, referred to as first connecting pads FPD1) and a second pad area FPA2 in which a second connecting pad FPD2 is provided in plurality (hereinafter, referred to as second connecting pads FPD2). The driving circuit board PB may include a driving pad area PPA in which a driving pad PPD is provided in plurality (hereinafter, referred to as driving pads PPD).

The first connecting pads FPD1 may be electrically connected to the pads DPD of the display panel DP such as by being in contact therewith. The second connecting pads FPD2 may be electrically connected to the driving pads PPD of the driving circuit board PB such as by being in contact therewith.

According to an embodiment of the invention, the display device DD may include a driving element DC disposed on the connecting circuit board FB. The driving element DC may be electrically connected to the first connecting pads FPD1 and the second connecting pads FPD2.

The driving circuit board PB may transmit driving signals required for the operation of the display device DD, to the driving element DC, through the driving pads PPD. The driving element DC may receive the driving signals through the second connecting pads FPD2 connected to the driving pads PPD. The driving element DC generates signals to be provided to the display panel DP on the basis of the received driving signals, and may provide the generated signals to the display panel DP, through the first connecting pads FPD1. As an example, the driving element DC may be a data driver for generating images signals and control signals to be provided to the data lines DL.

Referring to FIG. 5, among the pixels PX shown in FIG. 4, the pixel PX connected to any one scan line GL, any one data line DL, and the power line PL are exemplarily illustrated. The configuration of the pixel PX is not limited thereto, and may be modified and executed.

According to the invention, the pixel PX includes an organic light emitting element OLED, a first electrode, a second electrode, and a pixel circuit. The pixel PX includes the organic light emitting element OLED as a display element.

The pixel circuit includes a first transistor T1 (or a switching transistor), a second transistor T2 (or a driving transistor), and a capacitor as a circuit part for driving the organic light emitting element OLED. The pixel circuit may be included in the circuit element layer DP-CL shown in FIG. 2.

The organic light emitting element OLED generates light by an electrical signal provided from the first transistor T1 and the second transistor T2.

The first transistor T1 outputs a data signal applied to the data line DL in response to a gate signal applied to the scan line GL. The capacitor charges a voltage corresponding to the data signal received from the first transistor T1. A first power voltage ELVDD is provided to the first electrode through the second transistor T2, and a second power voltage ELVSS is provided to the second electrode. The second power voltage ELVSS may be a voltage lower than the first power voltage ELVDD.

The second transistor T2 is electrically connected to the organic light emitting element OLED through the first electrode. The second transistor T2 controls an electrical driving current flowing in the organic light emitting element OLED in correspondence to the amount of charge stored in the capacitor. The organic light emitting element OLED emits light during a turn-on period of the second transistor T2.

Figure 6:
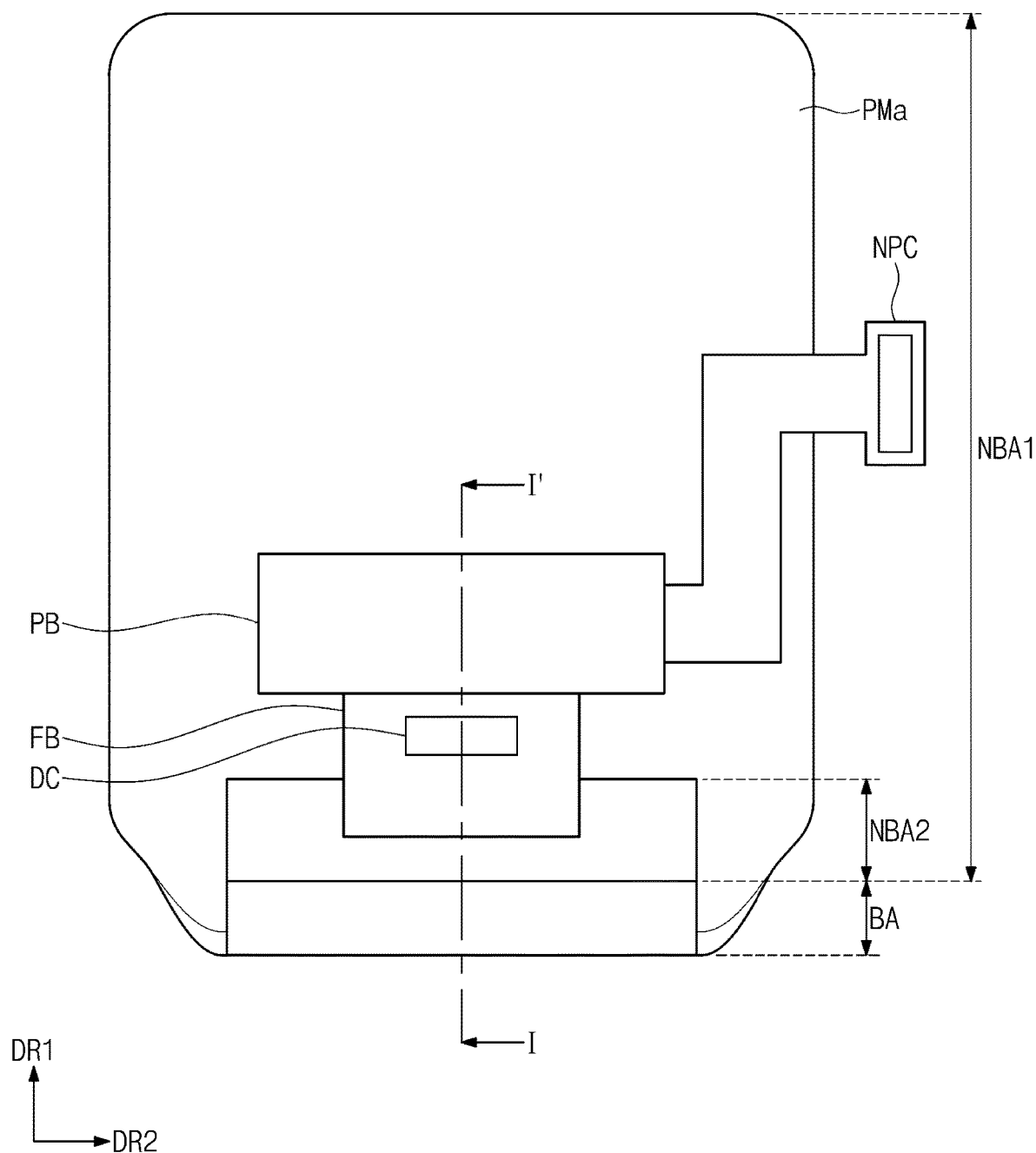
FIG. 6 is a top plan view showing an embodiment of a back surface of a display device.
Figure 7:
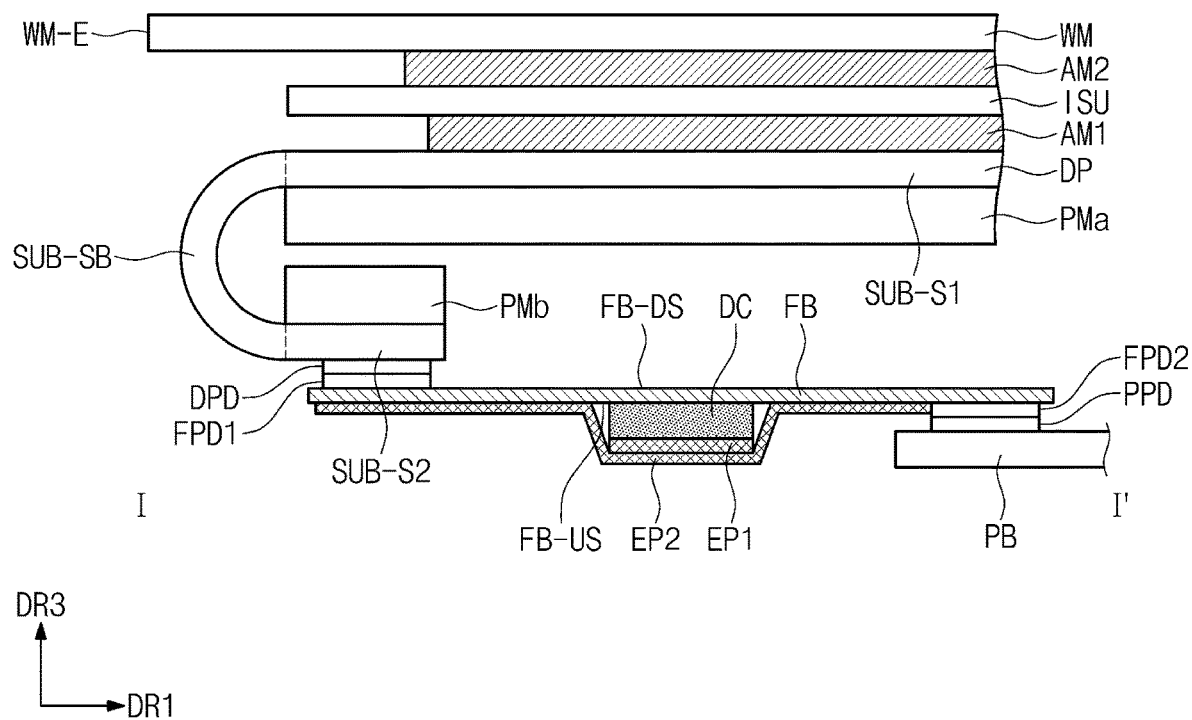
FIG. 7 is a cross-sectional view of an embodiment of an end portion of a display device taken along line I-I' shown in FIG. 6.
Figure 8:
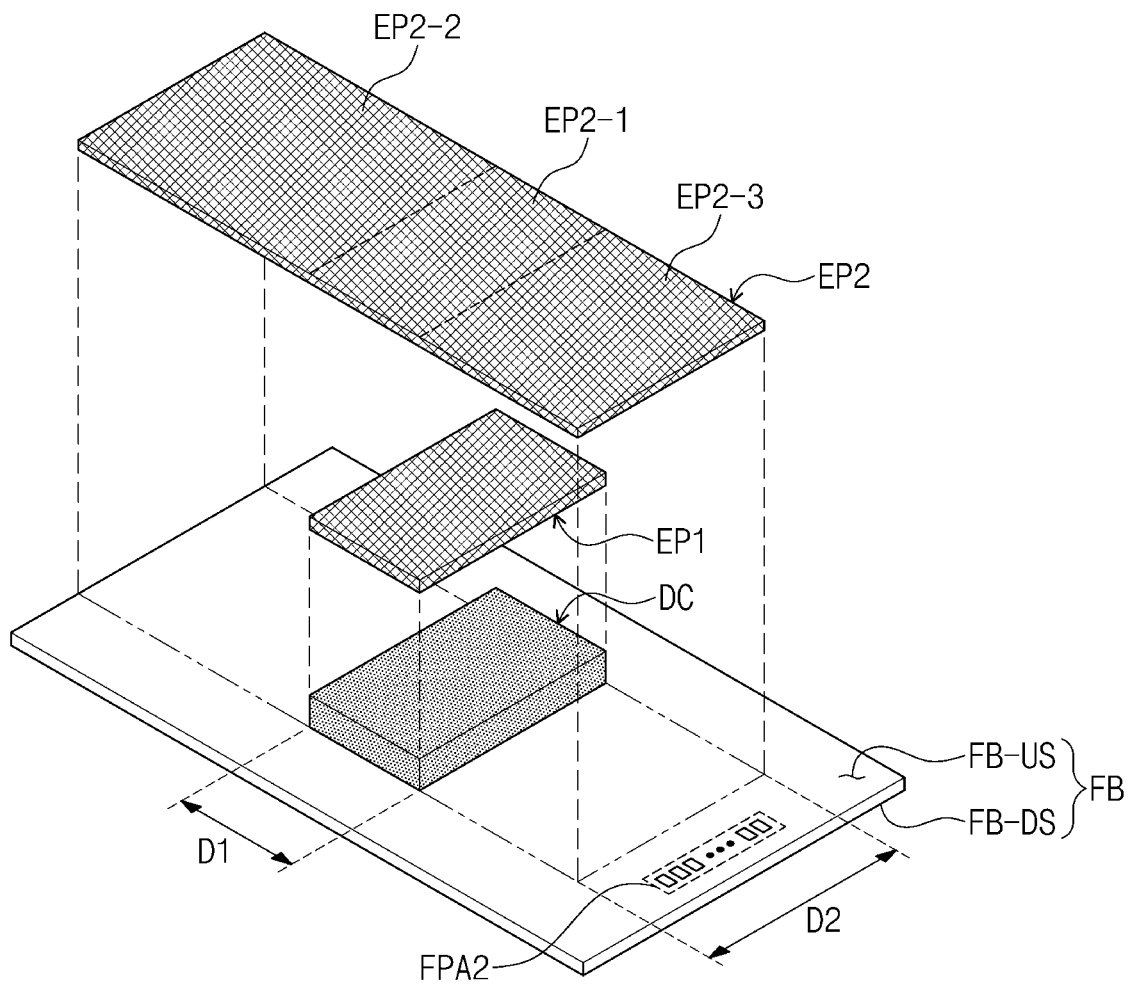
FIG. 8 is an exploded perspective view of an embodiment of a first shielding layer and a second shielding layer.
Figure 9:
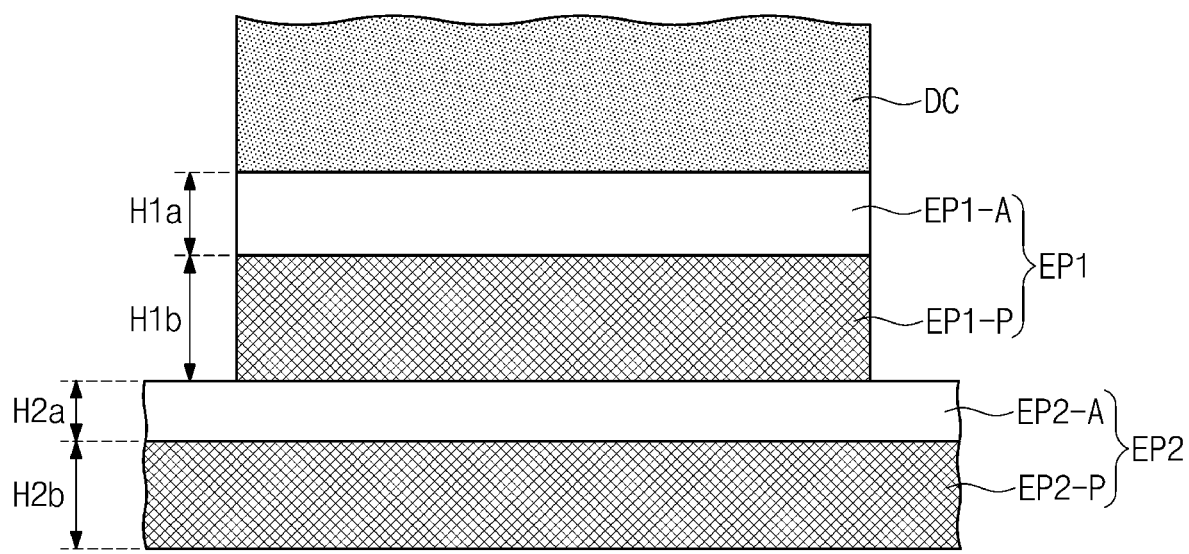
FIG. 9 is a cross-sectional view of the first shielding layer and the second shielding layer shown in FIG. 8.

FIG. 6 is a top plan view showing an embodiment of a back surface of a display device. FIG. 7 is a cross-sectional view of the display device taken along line I-I' shown in FIG. 6. FIG. 8 is an exploded perspective view of an embodiment of a first shielding layer and a second shielding layer. FIG. 9 is a cross-sectional view of the first shielding layer and the second shielding layer shown in FIG. 7.

Referring to FIG. 6 together with FIGS. 3 and 4, for example, the connecting circuit board FB and the driving circuit board PB disposed on a back surface of the display panel DP are illustrated. Also, the display device DD may further include a connector NPC disposed on the back surface of the display panel DP and connected to the driving circuit board PB. The connector NPC is connected to an external terminal (not shown) and may provide a power signal and various signals to the driving circuit board PB from outside the display device DD.

Referring to FIG. 7, the structure of the connecting circuit board FB connected to a first end of the display panel DP is illustrated. Particularly, the display panel DP shown in FIG. 7 is described as including the first flat portion SUB-S1, the second flat portion SUB-S2, and the bending portion SUB-SB of the base substrate SUB described with reference to FIG. 4.

The connecting circuit board FB includes an upper surface FB-US and a lower surface FB-DS. The lower surface FB-DS of the connecting circuit board FB is defined as a surface on which the first connecting pads FPD1 described with reference to FIG. 3 are disposed, and the upper surface FB-US of the connecting circuit board FB is defined as a surface on which the second connecting pads FPD2 described with reference to FIG. 3 are disposed. That is, the pads DPD disposed on the second flat portion SUB-S2 of the base substrate SUB are connected to the first connecting pads FPD1 disposed on the lower surface FB-DS of the connecting circuit board FB. The second connecting pads FPD2 disposed on the upper surface FB-US of the connecting circuit board FB are connected to the driving pads PPD disposed on the driving circuit board PB.

According to an embodiment of the invention, the driving element DC may be disposed on the upper surface FB-US of the connecting circuit board FB. That is, the driving element DC is disposed on a difference surface from the first connecting pads FPD1 connected to the pads DPD of the display panel DP, and may be disposed on the same surface as the second connecting pads FPD2 connected to the driving pads PPD of the driving circuit board PB.

Since the driving element DC is disposed on the upper surface FB-US of the connecting circuit board FB and not on the lower surface FB-DS of the connecting circuit board FB which faces the display panel DP, as shown in FIG. 6, the driving element DC may be exposed to outside the display device DD. Particularly, since an upper surface of the driving element DC is exposed to outside the display device DD, some circuits of the driving element DC may be damaged by external electro-static discharge transmitted through the upper surface of the driving element DC.

According to an embodiment of the invention, the display device DD includes a first shielding layer EP1 and a second shielding layer EP2 which protect the driving element DC. That is, the first shielding layer EP1 and the second shielding layer EP2 may protect the driving element DC from external static electricity.

In detail, referring to FIG. 8, the first shielding layer EP1 may be disposed on the upper surface of the driving element DC. Here, a lower surface of the driving element DC may be a surface disposed facing the connecting circuit board FB, and the upper surface of the driving element DC may be a surface which faces away from the connecting circuit board FB and is connected to the first shielding layer EP1.

According to an embodiment of the invention, a shape and a planar area of the first shielding layer EP1 may be substantially the same as a shape and a planar area of the driving element DC. In an embodiment, for example, the driving element DC may have a first planar area defined by a product of a first length D1 and a second length D2. The first length D1 and the second length D2 may correspond to a dimension of the driving element DC. Likewise, a portion of the first shielding layer EP1 may have a second planar area defined by the product of the first length D1 and the second length D2. Since the same of the first length D1 and the second length D2 are used for the first planar area and the second planar area, the first planar area may be the same of the second planar area.

As described above, since the upper surface of the driving element DC is covered by the first shielding layer EP1, transmission of external static electricity to the upper surface of the driving element DC may be reduced or effectively prevented. In this specification, "Component A covers Component B" means that Component A overlaps an entirety of the planar area of Component B, and may include that Component A is directly disposed on Component B, or disposed spaced apart therefrom by a predetermined interval or intervening component.

The second shielding layer EP2 covers the first shielding layer EP1 and may be disposed on the upper surface FB-US of the connecting circuit board FB. The second shielding layer EP2 may entirely cover the upper surface of the driving element DC, and extend along side surfaces thereof. Particularly, since the second shielding layer EP2 covers at least two side surfaces among side surfaces of the driving element DC (refer to FIG. 7), transmission of external static electricity to a side surface of the driving element DC may be reduced or effectively prevented by the second shielding layer EP2.

Particularly, the second shielding layer EP2 includes a first portion EP2-1, a second portion EP2-2, and a third portion EP2-3. The first portion corresponds to and covers the first shielding layer EP1 and is disposed between the second portion EP2-2 and the third portion EP2-3 along the first direction DR1.

The second portion EP2-2 and the third portion EP2-3 extend along two side surfaces of the driving element DC and cover the two side surfaces among the side surfaces of the driving element DC. The second portion EP2-2 and the third portion EP2-3 do not overlap the driving element DC in the top plan view and are disposed corresponding to portions of the upper surface FB-US of the connecting circuit board FB which are exposed outside the driving element DC. A portion of the second portion EP2-2 and the third portion EP2-3 may be spaced apart from the connecting circuit board FB and the driving element DC as shown in FIG. 7.

According to the above, the upper surface of the driving element DC disposed on the connecting circuit board FB may be double covered by the first shielding layer EP1 and the second shielding layer EP2. Also, at least two side surfaces among the side surfaces of the driving element DC may be covered by the second shielding layer EP2.

Accordingly, through the first shielding layer EP1 and the second shielding layer EP2 having a double structure, a blocking effect of external static electricity transmitted to the upper surface of the driving element DC may be further increased. Since the driving element DC is protected by the first shielding layer EP1 and the second shielding layer EP2, the overall driving reliability of the display panel DP may also be improved.

Referring to FIG. 9, the first shielding layer EP1 includes a first adhesive EP1-A and a first shielding film EP1-P. The first adhesive EP1-A may be disposed between the driving element DC and the first shielding film EP1-P. The first adhesive EP1-A may be an optically clear adhesive film, an optically clear resin, or a pressure sensitive adhesive film for fixing the driving element DC and the first shielding film EP1-P to each other. As an example, a thickness H1$a$ of the first adhesive EP1-A may about 10 micrometers (um).

The first shielding film EP1-P is disposed on the first adhesive EP1-A, and may be covered by the second shielding layer EP2. According to an embodiment, the first shielding film EP1-P may be a polymer film, and may be provided as polyimide ("PI"). However, the invention is not limited thereto. The first shielding film EP1-P may be provided as a different material. As an example, a thickness H1$b$ of the first adhesive film EP1-P may be about 22.5 micrometers (um).

The second shielding layer EP2 includes a second adhesive EP2-A and a second shielding film EP2-P. The second adhesive EP2-A may be disposed between the first shielding film EP1-P and the second shielding film EP2-P. The second adhesive EP2-A may be an optically clear adhesive film, an optically clear resin, or a pressure sensitive adhesive film for fixing the first shielding film EP1-P and the second shielding film EP2-P to each other. In an embodiment, for example, a thickness H2$a$ of the second adhesive EP2-A may be about 8.5 micrometers (um). According to an embodiment, the thickness H1$a$ of the first adhesive EP1-A may be greater than the thickness H2$a$ of the second adhesive EP2-A.

The second shielding film EP2-P may be disposed on the second adhesive EP2-A. According to an embodiment, the second shielding film EP2-P may be a polymer film, and may be provided as polyimide ("PI"). However, the invention is not limited thereto. The second shielding film EP2-P may be provided as a different material. As an example, a thickness H2$b$ of the second shielding film EP2-P may be about 12.5 micrometers (um). According to an embodiment, the thickness H1$b$ of the first shielding film EP1-P may be greater than the thickness H2$b$ of the second shielding film EP2-P.

According to an embodiment, a sum of a thickness of the first shielding layer EP1 and a thickness of the second shielding layer EP2 may be about 50 micrometers (um) to about 65 micrometers (um). That is, since the sum of the thickness of the first shielding layer EP1 and the thickness of the second shielding layer EP2 is above 50 micrometers (um) or greater, transmission of external static electricity to the driving element DC may be efficiently blocked.

Figure 10:
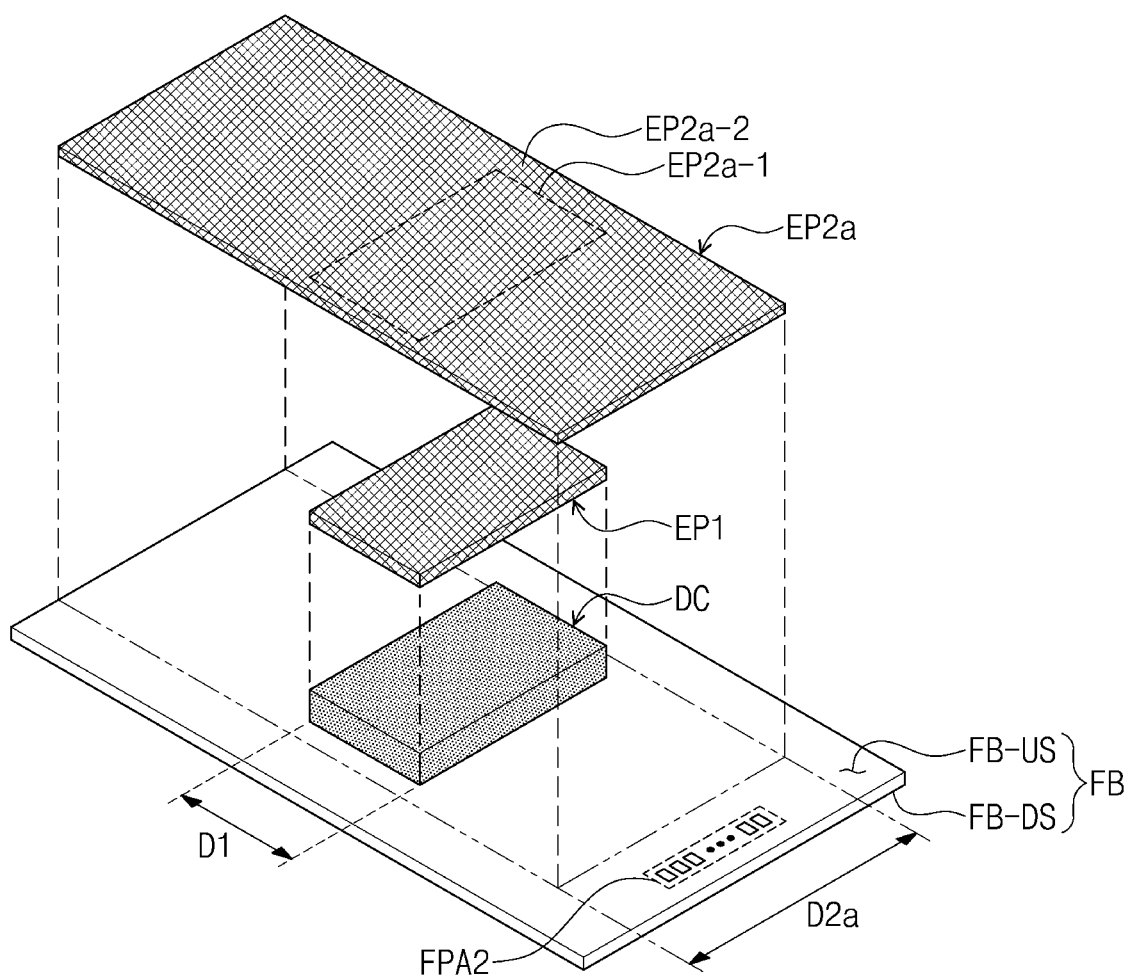
FIG. 10 is an exploded perspective view of another embodiment of a first shielding layer and a second shielding layer.

FIG. 10 is an exploded perspective view of another embodiment of a first shielding layer and a second shielding layer.

The connecting circuit board FB, the driving element DC, and the first shielding layer EP1 shown in FIG. 10 are substantially the same as those shown in FIG. 8, and only the structure of a second shielding layer EP2$a$ is changed. Accordingly, the description will be made based on the second shielding layer EP2$a$, the description of the remainder of the components will be omitted for convenience of description.

The second shielding layer EP2$a$ includes a first portion EP2$a$-1 overlapping the first shielding layer EP1 and a second portion EP2$a$-2 extended from the first portion EP2$a$-1. According to the invention, the second portion EP2$a$-2 of the second shielding layer EP2$a$ may surround the first portion EP2$a$-1 of the second shielding layer EP2$a$ in a top plan view. Also, the second portion EP2$a$-2 of the second shielding layer EP2$a$ covers the side surfaces of the driving element DC entirely, and may extend from the driving element DC to be disposed on the upper surface FB-US of the connecting circuit board FB.

The first length D1 may correspond to a dimension of the driving element DC, while a second length D2$a$ is greater than a dimension of the driving element DC. The first portion EP2$a$-1 of the second shielding layer EP2$a$ may have a planar area defined by a product of the first length D1 and a length of the driving element DC along the direction of the second length D2$a$. The second portion EP2$a$-2 of the second shielding layer EP2$a$ may have a total planar area defined by a product of the first length D1 and the second length D2$a$.

Figure 11:
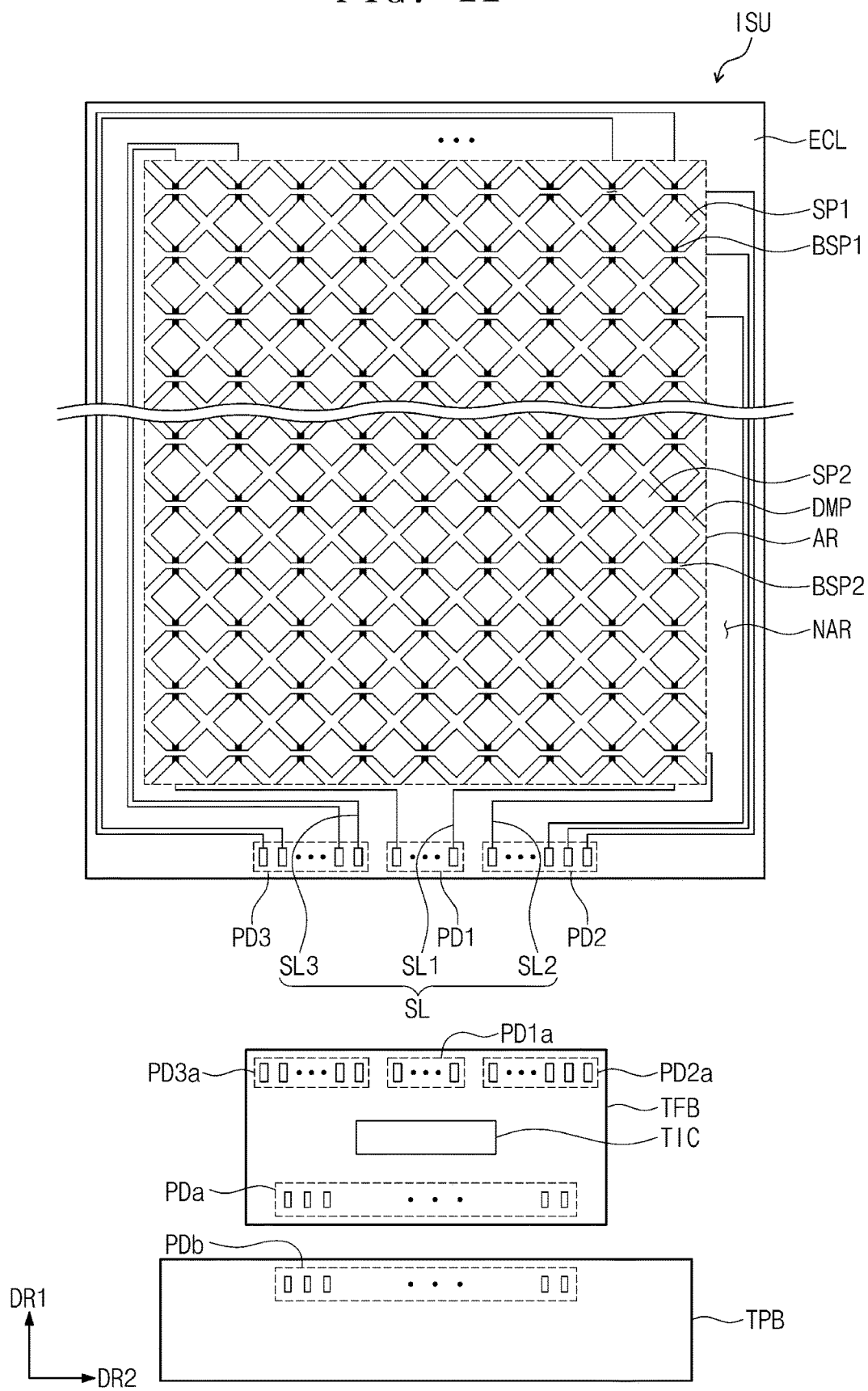
FIG. 11 is a top plan view of an embodiment of an input sensing unit of a display device.
Figure 12:
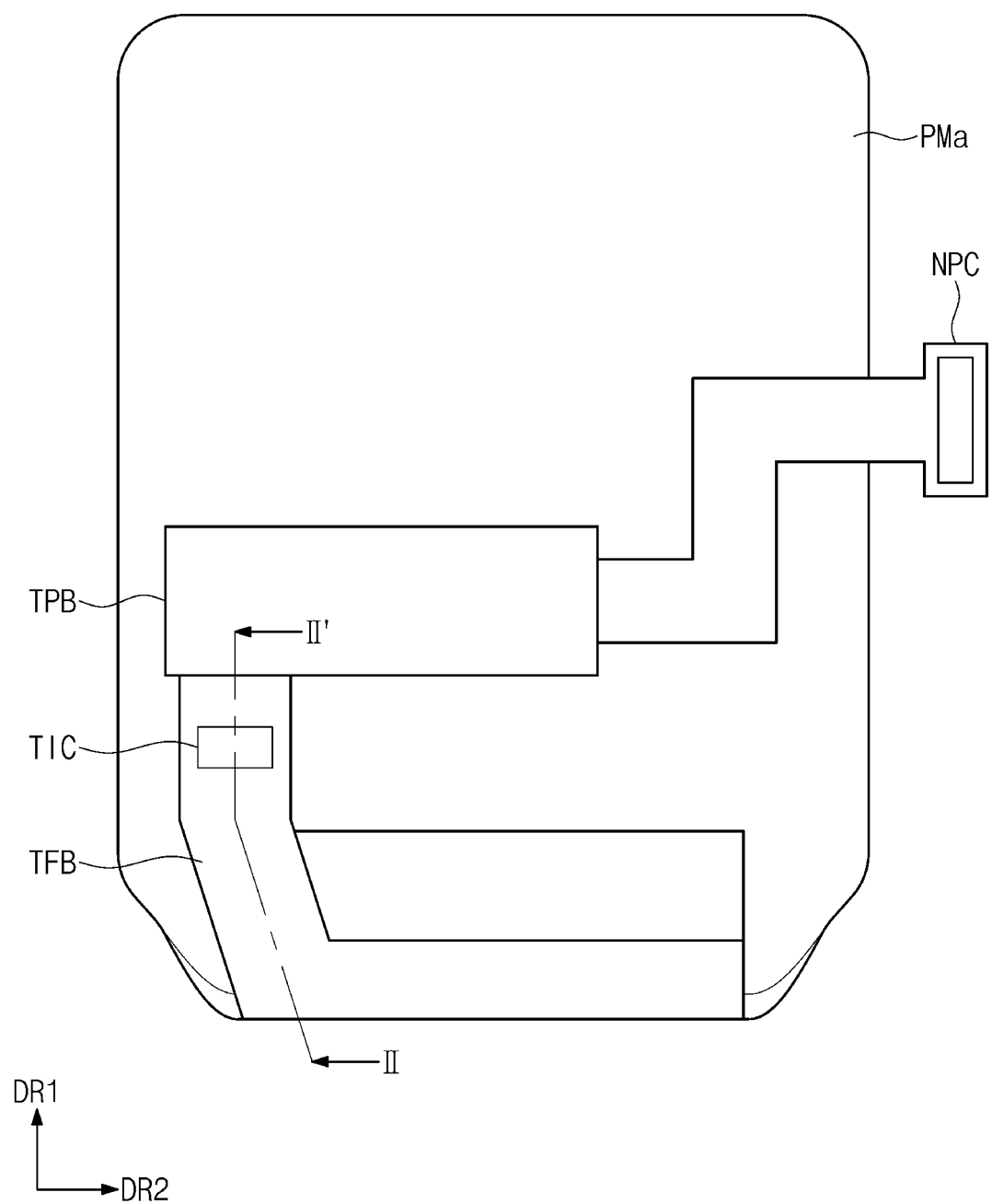
FIG. 12 is a top plan view showing another embodiment of a back surface of a display device.
Figure 13:
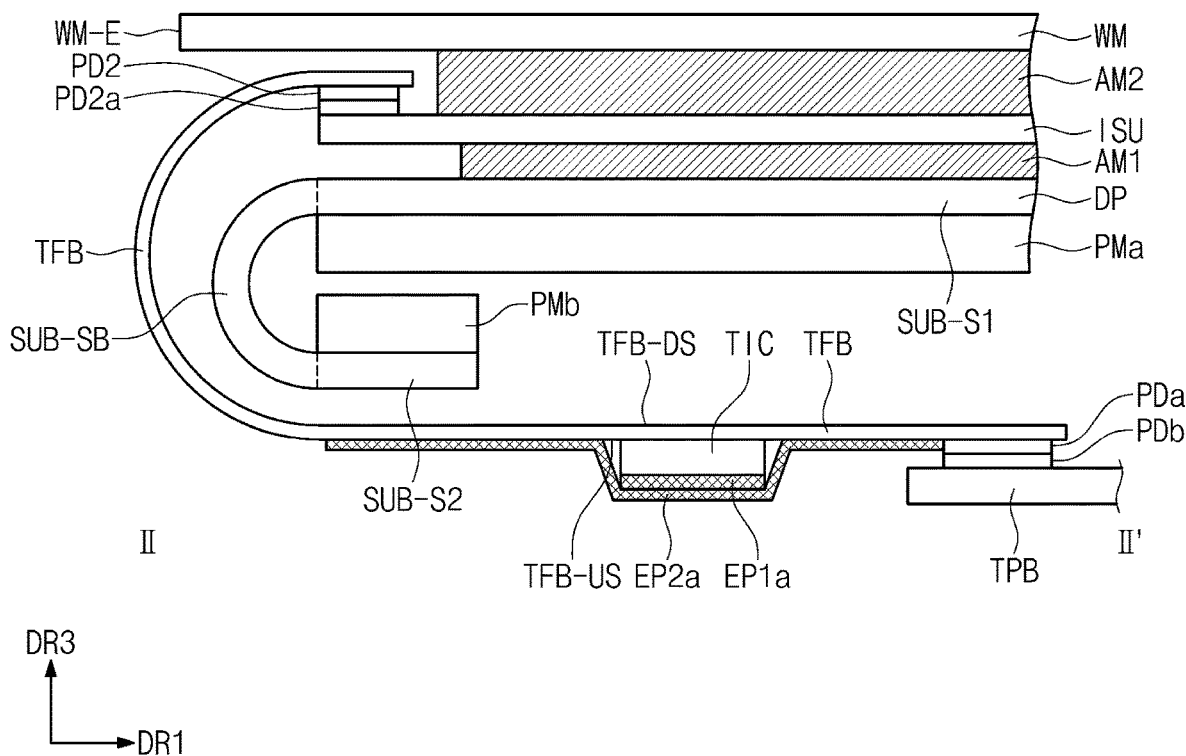
FIG. 13 is a cross-sectional view of an embodiment of an end portion of a display device taken along line II-IF shown in FIG. 12.

FIG. 11 is a top plan view of an embodiment of an input sensing unit. FIG. 12 is a top plan view showing another embodiment of a back surface of a display device. FIG. 13 is a cross-sectional view of the display device taken along line II-II' shown in FIG. 12.

Referring to FIG. 11, the input sensing unit ISU includes an active region AR and a non-active region NAR which is adjacent to the active region AR. The active region AR of the input sensing unit ISU may overlap the display area DP-DA of the display panel DP defined above. The non-display area DP-NDA of the display panel DP may overlap the non-active region NAR of the input sensing unit ISU. The non-active region NAR may be adjacent to one side of the active region AR, or be omitted. Hereinafter, according to the invention, the active region AR may be a region at which an input applied from the outside is sensed. The non-active region NAR may be a region at which an input applied from the outside is not sensed.

In detail, the input sensing unit ISU may include first sensing electrodes, second sensing electrodes, a first connecting pattern BSP1 provided in plurality (hereinafter, referred to as first connecting patterns BSP1), a second connecting pattern BSP2 provided in plurality (hereinafter, referred to as second connecting patterns BSP2), a plurality of sensing lines SL, and a plurality of first pads PD1, a plurality of second pads PD2 and a plurality of third pads PD3.

The first sensing electrodes and the second sensing electrodes overlap the active region AR. The first sensing electrodes are lengthwise extended along the first direction DR1 and arranged along the second direction DR2, and n first sensing electrodes may be provided (where n is a natural number). The first sensing electrodes are spaced apart from each other in a top plan view and include a first sensing pattern SP1 provided in plurality (hereinafter, referred to as first sensing patterns SP1) arranged along the first direction DR1.

The second sensing electrodes are lengthwise extended along the second direction DR2 and arranged along the first direction DR1, and m second sensing electrodes may be provided (where m is a natural number). The second sensing electrodes are spaced apart from each other in a top plan view and include a second sensing pattern SP2 provided in plurality (hereinafter, referred to as second sensing patterns SP2) arranged along the second direction DR2. The second sensing patterns SP2 are spaced apart from the first sensing patterns SP1 in a top plan view, and may be insulated therefrom.

The first connecting patterns BSP1 may the first sensing patterns SP1 to each other. In an embodiment, for example, one first connecting pattern BSP1 may electrically connect two first sensing patterns SP1 adjacent to each other along the second direction DR2 among the first sensing patterns SP1.

The second connecting patterns BSP2 may connect the second sensing patterns SP2 to each other. In an embodiment, for example, one second connecting pattern BSP2 may electrically connect two second sensing patterns SP2 adjacent to each other along the first direction DR1 among the second sensing patterns SP2.

The first connecting pattern BSP1 and the second connecting pattern BSP2 cross each other in a top plan view, and may be insulated from each other in cross-section (e.g., along the third direction DR3).

According to an embodiment, the first sensing patterns SP1, the second sensing patterns SP2, and the second connecting patterns BSP2 may each include a conductive material such as a metal material. As an example, the metal material may include, for example, molybdenum, silver, titanium, copper, aluminum, or an alloy thereof.

According to an embodiment, the first connecting patterns BSP1, the sensing lines SL, and the first pads PD1, the second pads PD2 and the third pads PD3 may include a transparent conductive oxide. In an embodiment, for example, the transparent conductive oxide may include at least one of indium zinc oxide ("IZO"), indium tin oxide ("ITO"), indium gallium oxide ("IGO"), indium zinc gallium oxide ("IGZO"), or a combination thereof. However, the invention is not limited thereto.

The first connecting patterns BSP1, the sensing lines SL, and the first pads PD1, the second pads PD2 and the third pads PD3 may each be disposed on a different layer from the first sensing patterns SP1, the second sensing patterns SP2, and the second connecting patterns BSP2, among layers within the input sensing unit ISU. However, the invention is not limited thereto, and the layer structure of each configuration may be variously modified according to embodiments.

The sensing lines SL include a first sensing line SL1 provided in plurality (hereinafter, referred to as first sensing lines SL1), a second sensing line SL2 provided in plurality (hereinafter, referred to as second sensing lines SL2), and a third sensing line SL3 provided in plurality (hereinafter, referred to as third sensing lines SL3) all overlapping the non-active region NAR. The first sensing lines SL1, the second sensing lines SL2 and the third sensing lines SL3 may each include a metal material.

First ends of the first sensing lines SL1 are respectively connected to the first sensing patterns SP1, and second ends of the first sensing lines SL1 which oppose the first ends thereof, are respectively connected to first pads PD1. Here, the first sensing patterns SP1 respectively connected to the first ends of the first sensing lines SL1 are adjacent to the first pads PD1, and may be sensing patterns of a first row arranged along the first direction DR1.

First ends of the second sensing lines SL2 are respectively connected to the second sensing patterns SP2, and second ends of the second sensing lines SL2 which are opposite to the first ends thereof are respectively connected to the second pads PD2. Here, the second sensing patterns SP2 respectively connected to the first ends of the second sensing lines SL2 may be sensing patterns of a first column extended along the second direction DR2.

First ends of the third sensing lines SL3 are respectively connected to the first sensing patterns SP1, and second ends of the third sensing lines SL3 which are opposite to the first ends thereof are respectively connected to the third pads PD3. Here, the first sensing patterns SP1 respectively connected to the first ends of the third sensing lines SL3 are arranged along the first direction DR1, and may be patterns of the $n^{th}$ row which are farthest from the first row along the second direction DR2.

The first sensing lines SL1, the second sensing lines SL2 and the third sensing lines SL3 may be provided with an electrical signal from the first pads PD1, the second pads PD2 and the third pads PD3, respectively.

The first sensing lines SL1, the second sensing lines SL2 and the third sensing lines SL3 may provide a driving signal from the first pads PD1, the second pads PD2 and the third pads PD3 to first sensing patterns SP1 and the second sensing patterns SP2 both disposed in the active region AR. Also, the first sensing lines SL1, the second sensing lines SL2 and the third sensing lines SL3 may transmit an external input signal generated in the active region AR to corresponding pads among the first pads PD1, the second pads PD2 and the third pads PD3.

The display device DD according to the invention may include a first circuit board TFB connected to an end of the input sensing unit ISU and a second circuit board TPB connected to an end of the first circuit board TFB.

The first circuit board TFB may be provided as a flexible printed circuit board. The first circuit board TFB includes a plurality of first to third connecting pads PD1a, PD2a, and PD3a electrically connected to the first pads PD1, the second pads PD2 and the third pads PD3, respectively, such as by being in contact therewith. Also, a plurality of connecting pads PDa connected to the first circuit board TFB and the second circuit board TPB are included.

The second circuit board TPB includes a plurality of driving pads PDb electrically connected to the plurality of connecting pads PDa, such as by being in contact therewith.

According to an embodiment of the invention, the display device DD may include a sensing driving element TIC disposed on the first circuit board TFB. The sensing driving element TIC may be electrically connected to the first to third connecting pads PD1a, PD2a, and PD3a, and to the connecting pads PDa.

The second circuit board TPB may transmit driving signals required for the operation of the input sensing unit ISU, to the sensing driving element TIC, through the driving pads PDb. The sensing driving element TIC may receive the driving signals through the connecting pads PDa connected to the driving pads PDb. The sensing driving element TIC generates signals to be provided to the input sensing unit ISU on the basis of the received driving signals, and may provide the generated signals to the input sensing unit ISU through the first to third connecting pads PD1a, PD2a, and PD3a. Also, the sensing driving element TIC may receive signals transmitted from the input sensing unit ISU through the first to third connecting pads PD1a, PD2a, and PD3a.

Referring to FIG. 12 and FIG. 13, the first circuit board TFB may be disposed on a first protective layer PMa disposed on a lower portion of the display panel DP and on the second flat portion SUB-S2 of the base substrate SUB. Also, the first circuit board TFB includes an upper surface TFB-US and a lower surface TFB-DS. The sensing driving element TIC may be disposed on the upper surface TFB-US of the first circuit board TFB.

According to an embodiment of the invention, the display device DD includes a first shielding layer EP1a and a second shielding layer EP2a for protecting the sensing driving element TIC from external static electricity. The first shielding layer EP1a shown in FIG. 13 may be otherwise referred to as a third shielding layer, and the second shielding layer EP2a may otherwise be referred to as a fourth shielding layer.

The first shielding layer EP1a may cover an upper surface of the sensing driving element TIC. As described above, when the first shielding layer EP1a covers the upper surface of the sensing driving element TIC, the first shielding layer EP1a overlaps the sensing driving element TIC entirely. That is, the planar area of the first shielding layer EP1a may be the same as the planar area of the sensing driving element TIC.

The second shielding layer EP2a includes a first portion covering the first shielding layer EP1a, and second portion which extends from the first portion and covers at least two side surfaces among side surfaces of the sensing driving element TIC. The second portion of the second shielding layer EP2a may be disposed on the second circuit board TPB.

According to the embodiment of the invention, a thickness of the first shielding layer EP1a may be greater than a thickness of the second shielding layer EP2a. Also, as an example, a sum of the thickness of the first shielding layer EP1a and the thickness of the second shielding layer EP2a may be about 50 micrometers (um) to about 65 micrometers (um). Since the sum of the thickness of the first shielding layer EP1a and the thickness of the second shielding layer EP2a is about 50 micrometers (um) or greater, transmission of external static electricity to the sensing driving element TIC may be reduced or effectively prevented.

As described above, through the first shielding layer EP1a and the second shielding layer EP2a having a double structure, a blocking effect of external static electricity transmitted to the upper surface of the sensing driving element TIC may be further increased. Since the sensing driving element TIC is protected by the first shielding layer EP1a and the second shielding layer EP2a, the overall driving reliability of the input sensing unit ISU may also be improved.

According to an embodiment of the invention, a driving element disposed on a connecting circuit board may be protected from external static electricity by a double shielding structure which covers the drive element. As a result, the overall driving reliability of a display panel may be improved.

As described above, embodiments of the invention have been disclosed in the drawing and the specification. Although specific terms have been used herein, they have been merely used for the purpose of describing the invention, and are not intended to limit the meaning or the scope of the invention as set forth in the claims. Therefore, it will be understood by those skilled in the art that various modifications and equivalent embodiments may be made therefrom. Therefore, the true technical protection scope of the invention should be determined by the technical spirit of the appended claims.

What is claimed is:

1. A display device comprising:
 a display panel;
 a connecting circuit board physically connected to the display panel and through which a signal is provided to the display panel;
 a driving circuit board physically connected to the connecting circuit board;
 a driving element disposed on the connecting circuit board and comprising a first surface, and a second surface facing the connecting circuit board and which is opposite to the first surface;
 a first shielding layer disposed on the first surface of the driving element which is exposed outside the display device; and
 a second shielding layer overlapping an entirety of the first shielding layer disposed on the connecting circuit board.

2. The display device of claim 1, wherein
 the first shielding layer comprises a first shielding film, and a first adhesive which is disposed between the driving element and the first shielding film, and
 the second shielding layer comprises a second shielding film, and a second adhesive which is disposed between the first shielding film and the second shielding film.

3. The display device of claim 2, wherein along a thickness direction of the connecting circuit board, a thickness of the first shielding film is greater than a thickness of the second shielding film.

4. The display device of claim 2, wherein along a thickness direction of the connecting circuit board, a thickness of the first adhesive is greater than a thickness of the second adhesive.

5. The display device of claim 1, wherein a planar area of the first shielding layer is the same as a planar area of the driving element.

6. The display device of claim 5, wherein a planar area of the second shielding layer is greater than the planar area of the first shielding layer.

7. The display device of claim 1, wherein
 the second shielding layer comprises:
  a first portion corresponding to an entirety of a planar area of the driving element,
  a second portion and a third portion between which is disposed the first portion, and the second portion and the third portion respectively extend from sides of the first portion which oppose each other along a direction, to both cover side surfaces of the driving element which oppose each other along the direction and to overlap the connecting circuit board.

8. The display device of claim 7, wherein a portion of each of the second portion and the third portion does not overlap the planar area of the driving element and is spaced apart from the connecting circuit board and the side surfaces of the driving element.

9. The display device of claim 1, wherein the second shielding layer comprises:
a first portion corresponding to an entirety of a planar area of the driving element, and
a second portion which surrounds the first portion in a top plan view, the second portion extending from all sides of the first portion to both cover all side surfaces of the driving element respectively corresponding to the all sides of the first portion and to overlap the connecting circuit board.

10. The display device of claim 1, wherein
the display panel comprises:
a base substrate including a bending portion at which the display panel is bendable, and a first flat portion and a second flat portion facing each other and spaced apart from each other with the bending portion interposed therebetween; and
a display element layer with which an image is displayed, disposed on the first flat portion of the base substrate, and
the connecting circuit board is connected to the display panel at the second flat portion of the base substrate.

11. The display device of claim 10, wherein
the connecting circuit board comprises an upper surface facing the driving element and a lower surface which is opposite to the upper surface,
the driving circuit board is connected to the connecting circuit board at the upper surface of the connecting circuit board, and
the base substrate of the display panel is connected to the connecting circuit board at the lower surface of the connecting circuit board.

12. The display device of claim 11, wherein
the display panel comprises a pad disposed on the second flat portion and through which a signal is received from the connecting circuit board;
the driving circuit board comprises a driving pad through which the signal is transmitted to the connecting circuit board; and
the connecting circuit board comprises:
a first connecting pad disposed facing the lower surface and electrically connected to the pad of the display panel, and
a second connecting pad disposed facing the upper surface and electrically connected to the driving pad of the driving circuit board.

13. The display device of claim 1, further comprising:
an input sensing unit which is disposed on the display panel and with which an external input is sensed;
a first circuit board physically connected to the input sensing unit;
a second circuit board physically connected to the first circuit board;
a sensing driving element disposed on the first circuit board;
a third shielding layer disposed on the sensing driving element which is exposed outside the display device; and
a fourth shielding layer overlapping an entirety of the third shielding layer disposed on the first circuit board.

14. The display device of claim 13, wherein the connecting circuit board and the first circuit board are each a flexible circuit board.

15. The display device of claim 13, wherein a planar area of the third shielding layer is the same as a planar area of the sensing driving element.

16. The display device of claim 15, wherein the fourth shielding layer comprises:
a first portion corresponding to an entirety of the planar area of the sensing driving element, and
a second portion extended from two sides of the first portion to both cover two side surfaces of the sensing driving element which correspond to the two sides of the first portion and to overlap the second circuit board.

17. A display device comprising:
a display panel;
an input sensing unit which is disposed on the display panel;
a first circuit board physically connected to the input sensing unit and through which a signal is provided to the input sensing unit;
a second circuit board physically connected to the first circuit board and from which the signal is provided to the first circuit board;
a sensing driving element disposed on the first circuit board and comprising a first surface, and a lower surface facing the connecting circuit board and which is opposite to the first surface;
a first shielding layer disposed on the first surface of the sensing driving element; and
a second shielding layer overlapping an entirety of the first shielding layer and disposed on the first circuit board.

18. The display device of claim 17, wherein
along a thickness direction of the first circuit board, a first thickness of the first shielding layer is greater than a second thickness of the second shielding layer, and
a sum of the first thickness and the second thickness is about 50 micrometers to about 65 micrometers.

19. The display device of claim 17, wherein a planar area of the first shielding layer is the same as a planar area of the sensing driving element.

20. The display device of claim 17, further comprising an adhesive layer which is between the display panel and the input sensing unit.

* * * * *